US010666187B2

(12) United States Patent
Williamson

(10) Patent No.: US 10,666,187 B2
(45) Date of Patent: May 26, 2020

(54) LESS THAN MAXIMUM EFFECTIVE SOLAR DESIGN

(71) Applicant: Kirk Williamson, Dallas, TX (US)

(72) Inventor: Kirk Williamson, Dallas, TX (US)

(73) Assignee: Key Solar Solutions LLC, Dallas, TX (US)

( * ) Notice: Subject to any disclaimer, the term of this patent is extended or adjusted under 35 U.S.C. 154(b) by 214 days.

(21) Appl. No.: 15/374,425

(22) Filed: Dec. 9, 2016

(65) Prior Publication Data

US 2018/0165382 A1    Jun. 14, 2018

(51) Int. Cl.
*H02S 20/23* (2014.01)
*H02S 99/00* (2014.01)
*G06F 30/13* (2020.01)

(52) U.S. Cl.
CPC .............. *H02S 20/23* (2014.12); *H02S 99/00* (2013.01); *G06F 30/13* (2020.01); *Y02B 10/12* (2013.01)

(58) Field of Classification Search
CPC ......... H02S 20/23; H02S 99/00; Y02B 10/12; G06F 17/50; G06F 17/5004; G06F 30/13
USPC .......................................................... 703/18
See application file for complete search history.

(56) References Cited

U.S. PATENT DOCUMENTS

| | | | |
|---|---|---|---|
| 4,153,476 A | 5/1979 | Frosch | |
| 6,410,843 B1 | 6/2002 | Kishi et al. | |
| 7,238,879 B2 * | 7/2007 | Matsushita | H02S 30/10 136/251 |
| 7,500,391 B2 * | 3/2009 | Woro | G01W 1/12 73/170.27 |
| 7,832,267 B2 * | 11/2010 | Woro | G06F 17/5004 73/170.27 |
| 7,904,382 B2 * | 3/2011 | Arfin | G06Q 30/0601 705/38 |
| 8,145,578 B2 * | 3/2012 | Pershing | G06Q 10/00 705/400 |
| 8,249,902 B2 * | 8/2012 | Arfin | G06Q 30/0202 705/7.11 |
| 8,818,924 B2 | 8/2014 | Wayne et al. | |
| 8,853,525 B2 | 10/2014 | Beckerman et al. | |
| 9,134,353 B2 * | 9/2015 | Jia | G06Q 40/04 |
| 2007/0150198 A1 * | 6/2007 | MacDonald | G01J 1/4228 702/2 |
| 2008/0262789 A1 * | 10/2008 | Pershing | G06Q 10/00 702/156 |
| 2009/0132436 A1 * | 5/2009 | Pershing | G06Q 30/02 705/400 |
| 2009/0177458 A1 * | 7/2009 | Hochart | G06T 17/05 703/18 |
| 2010/0218108 A1 * | 8/2010 | Crabtree | G06Q 50/06 715/738 |
| 2010/0313933 A1 * | 12/2010 | Xu | H02S 40/22 136/246 |

(Continued)

*Primary Examiner* — Sheree N Brown

(57) ABSTRACT

A method of designing bifacial solar panels installations that does not rely on the use of all available space to maximize electrical output and return on investment. Instead, the design method relies on building a solar farm that provides the buyer with less than optimal electrical output but meets requirements to improve the return and breakeven over traditional installations. The method weighs financial variables against the design criteria to achieve a new less than maximum effectiveness of the system.

1 Claim, 10 Drawing Sheets

(56) References Cited

U.S. PATENT DOCUMENTS

Figure 1:
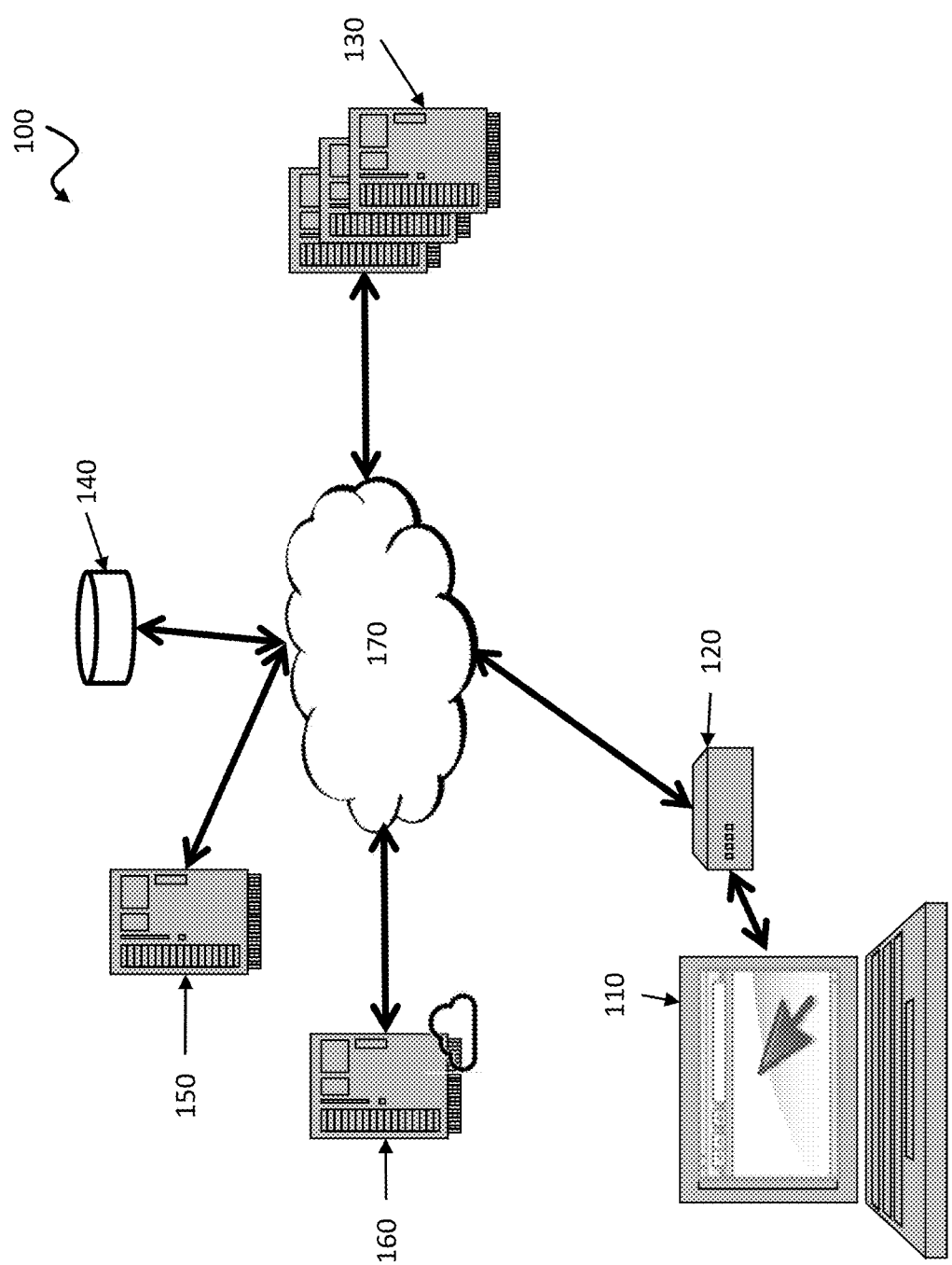

| | | | |
|---|---|---|---|
| 2010/0332373 A1* | 12/2010 | Crabtree | G06Q 40/04 705/37 |
| 2011/0023938 A1 | 2/2011 | Buchel et al. | |
| 2011/0162315 A1* | 7/2011 | Napora | E04D 3/08 52/656.9 |
| 2012/0199199 A1 | 8/2012 | Wood et al. | |
| 2013/0128326 A1 | 5/2013 | Apnes et al. | |
| 2013/0160850 A1 | 6/2013 | Apnes et al. | |
| 2013/0276865 A1 | 10/2013 | Apnes et al. | |
| 2013/0312811 A1 | 11/2013 | Apnes et al. | |
| 2014/0005845 A1* | 1/2014 | Thomas | H02J 3/385 700/291 |
| 2014/0130842 A1* | 5/2014 | Castillo-Aguilella | H01L 31/0504 136/246 |
| 2015/0066442 A1* | 3/2015 | Pryor | G06F 17/5009 703/1 |
| 2015/0094968 A1* | 4/2015 | Jia | G06Q 40/04 702/60 |
| 2015/0239365 A1* | 8/2015 | Hyde | B60L 11/1861 701/2 |
| 2015/0331972 A1* | 11/2015 | McClure | H02S 10/00 703/2 |
| 2016/0020351 A1* | 1/2016 | Castillo-Aguilella | H01L 31/0684 136/251 |
| 2016/0072287 A1* | 3/2016 | Jia | G06Q 40/04 700/295 |
| 2016/0225931 A1* | 8/2016 | Heng | H01L 31/18 |
| 2017/0038416 A1* | 2/2017 | Hoshika | G06Q 50/06 |
| 2017/0110622 A1* | 4/2017 | de Vries | C25D 7/126 |
| 2017/0148942 A1* | 5/2017 | Van Roosmalen | H01L 31/048 |
| 2017/0256661 A1* | 9/2017 | Xu | H01L 31/02242 |
| 2018/0003656 A1* | 1/2018 | Michini | H02S 50/10 |
| 2018/0019349 A1* | 1/2018 | Erben | H01L 31/0201 |
| 2018/0119994 A1* | 5/2018 | Helming | H02S 10/30 |

* cited by examiner

LESS THAN MAXIMUM EFFECTIVE SOLAR DESIGN

CROSS-REFERENCE TO RELATED APPLICATIONS

A claim of priority is made in this application based on Provisional Application Ser. No. 62/412,878 filed on Oct. 26, 2016 and entitled "Less Than Maximum Effective Solar Design" the disclosure of which is hereby incorporated by reference in its entirety.

BACKGROUND

Field of Invention

The invention related to the system and method of designing a bifacial solar panel installation.

Background of the Invention

The present invention is a useful and novel method for planning the installation design of a bifacial solar system.

Solar energy is generated by photovoltaic (PV) cells inside a solar panel. Photovoltaic cells collect solar radiation and convert that radiation to variable direct current (DC). A solar panel, also referred to as a solar module, contains a series of photovoltaic cells. The modules are then either roof or ground mounted in a series. A limited number of panels are grouped by the same inverter and referred to as an array. The inverter, also referred to as a converter, is responsible for converting the variable direct current output of a photovoltaic solar panel into a utility frequency alternating current (AC) that can be fed into an electrical network. A photovoltaic system, or installation, or farm, comprises a group of solar arrays and the balance-of-system components. Besides inverters, balance-of-system components include meters, instrumentation, safety equipment, and power-conditioning equipment.

Due to the previous high costs of PV cells, solar energy was slow to be adopted. Initial consumer adoptions were limited to small electronics such as outdoor lighting. Large scale early adoptions were primarily by governments for remote or space energy needs. Only relatively recently, the hardware's cost per watt has been reduced enough to provide commercial buyers with a justifiable economic return.

Despite being around since the 1970s, bifacial solar panels are emerging in the commercial building markets. The market penetration of these installations remains in the low single digits. The high cash outlay, cost per watt, roof design requirements and low bifacial module availability have limited the market.

Bifacial solar means that both faces, also referred to as sides, of the module are designed to generate energy. Each side of the panel is comprised of transparent encapsulating material with glass as the most common material. This is different than a traditional solar panel that is monofacial and therefore only the front side, or the side facing the sun, generates energy. The front side of the bifacial panel is orientated toward the sun and collects incident light directly from the sun. The back side of the bifacial panel allows reflected light from surfaces surrounding the panel to be collected. The proportion of the incident light that is reflected by a surface is albedo light. So rather than enclose the back side of the panel with a reflective material, as in a monofacial design, glass is used in its place to allow sunlight through the rear panel. The two glass panels enclose a sheet of bifacial PV cells. Other designs include pod-like bifacial PV cells that allow light to penetrate from the front glass surface of the cell directly through the back-glass surface of the cell. Another design uses a front design like that used in traditional panels with industry-standard screen printed PV cells but replaces the reflective aluminum back with a finger grid embedded in glass. An evacuated bifacial tube design, originally developed in the 1980s, is a tube formed from two glass tubes with the inner tube coated with a solar absorbing material. The space between the two tubes is evacuated to form a vacuum and then the tubes are fused at the top and bottom.

The relative additional energy obtained by a bifacial system compared to a monofacial reference is expressed as bifacial gain and credited to the gain by the back panel. Today, bifacial gain is generally believed to about a 10 (ten) to 25 (twenty-five) percent improvement over a monofacial solar panel but some manufacturers are claiming gains nearing an average of 50 (fifty) percent. For the initial cost analysis, the manufacturer of the panel will provide more exact results by geography. Individual studies show a large variation from day to day ranging from 0 (zero) percent to 240 (two hundred and forty) percent. Bifacial gains in snowy regions have sometimes been in excess of 60 (sixty) percent as the front face is covered with snow and the highly-reflective snow has a high albedo. Depending on the orientation of the module, the module may generate more power from the front of the panel during the first part of the day and then more from the back during the remainder of the sun duration. In addition to the bifacial gain, the bifacial modules have lower operating temperatures which results in a higher energy yield. It also possible to increase the output from a bifacial installation by using trackers, mounting that follows the path of the sun, because the clearance increases the amount of light falling on the back panel.

While this specification will focus on rooftop commercial applications, the ability of the bifacial module to collect light on both sides, combined with their ability to let light pass through the two faces, have introduced new placement possibilities for architects and engineers. These include:

Traffic sound barriers, even on curved roads.

Glass roofs that both harvest the sun and provide interior lighting.

Vertical railing for buildings especially on roof perimeters.

Awnings and terrace roofing to limit the amount of light but keep some natural light.

Carports that provide reflected light even when populated with vehicles.

Skylights

Fences

Canopies

Building facades.

For buyers, bifacial panels are inherently higher in cost than traditional monofacial panels because they use a more expensive PV silicon cell, require two panes of glass and have lower production volume. The two glass panes are heavier than a traditional panel which also increases the costs of handling, shipping, racking and labor. Taken together, the bifacial panel installation can be upwards of 40% (forty percent) higher in final cash outlay.

The roof of rooftop installation serves the primary function of providing reflected light to back side of the panel. As such, the roof of the commercial building may be required to have improvements to provide optimized reflectivity to the back panel. These costs include engineering and design; roofing materials such as a new membrane and flashing and adhesive; and labor. These costs may average building owners an additional US $5 (five dollars) per square foot at the time of this application. Added to the additional cost of bifacial panels over traditional panels, the new roofing costs have contributed significantly to the low market penetration bifacial panels suffer today. Even with the bifacial gain, the additional solar and roof cost increase the breakeven point, often to unacceptable levels.

To overcome these problems, planners must innovate in the design of the installation. Traditional panel installation design rules lay at the heart of failed bifacial installation projects. The maxim for monofacial installation is to maximize the energy output which then maximizes the energy offset of the building. This results in a maximum panel density design. A maximum density design provides the highest count of modules the designer can place where the number approached the calculated maximum number of modules. However, with average energy gains of a bifacial panel averaging only 20% (twenty percent) and the installed cost nearly doubling for bifacial, it is impossible to justify a bifacial installation based on maximum effective energy output or offset.

All the traditional and bifacial solar installations heretofore known suffer from a number of disadvantages:
1. The designs rely on maximizing to total available outside space to drive return on investment;
2. The designs increase long-term maintenance costs;
3. The designs increase long-term replacement costs;
4. The designs fail to meet financial objectives of commercial users.

SUMMARY OF THE INVENTION

An invention, which meets the needs stated above, is a system and method to increase the market penetration of bifacial modules by providing a design methodology that fails to maximize total output in exchange for better financial incentives for the buyers.

Objects and Advantages

Accordingly, besides the objects and advantages of the system for less than maximum solar design described above, several objects and advantages of the present invention are:
a) to provide panel manufacturers with design methodology that meets market requirements;
b) to provide seller with design tools that allow the seller to match the farm's design to the non-effective criteria of the buyer;
c) to provide designer's with lower hardware and communication cost to manage design software system requirements.

Further objects and advantages of this invention will become apparent from a consideration of the drawings and the ensuing description of the drawings.

DRAWING FIGURES

Figure 2:
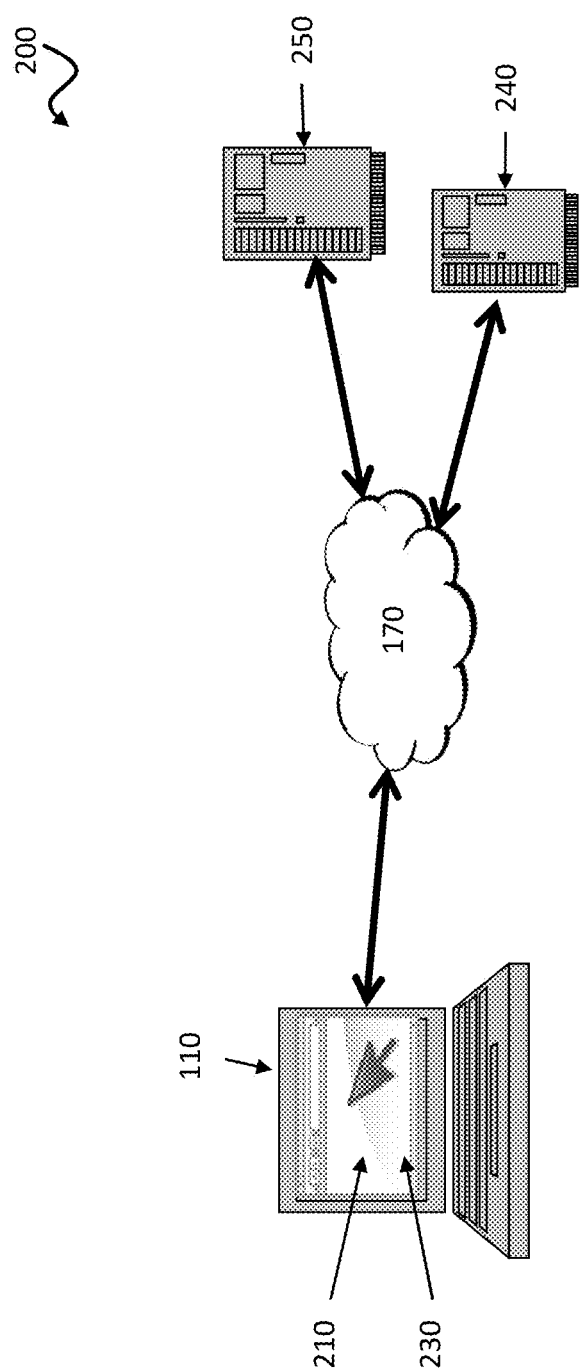
Figure 3:
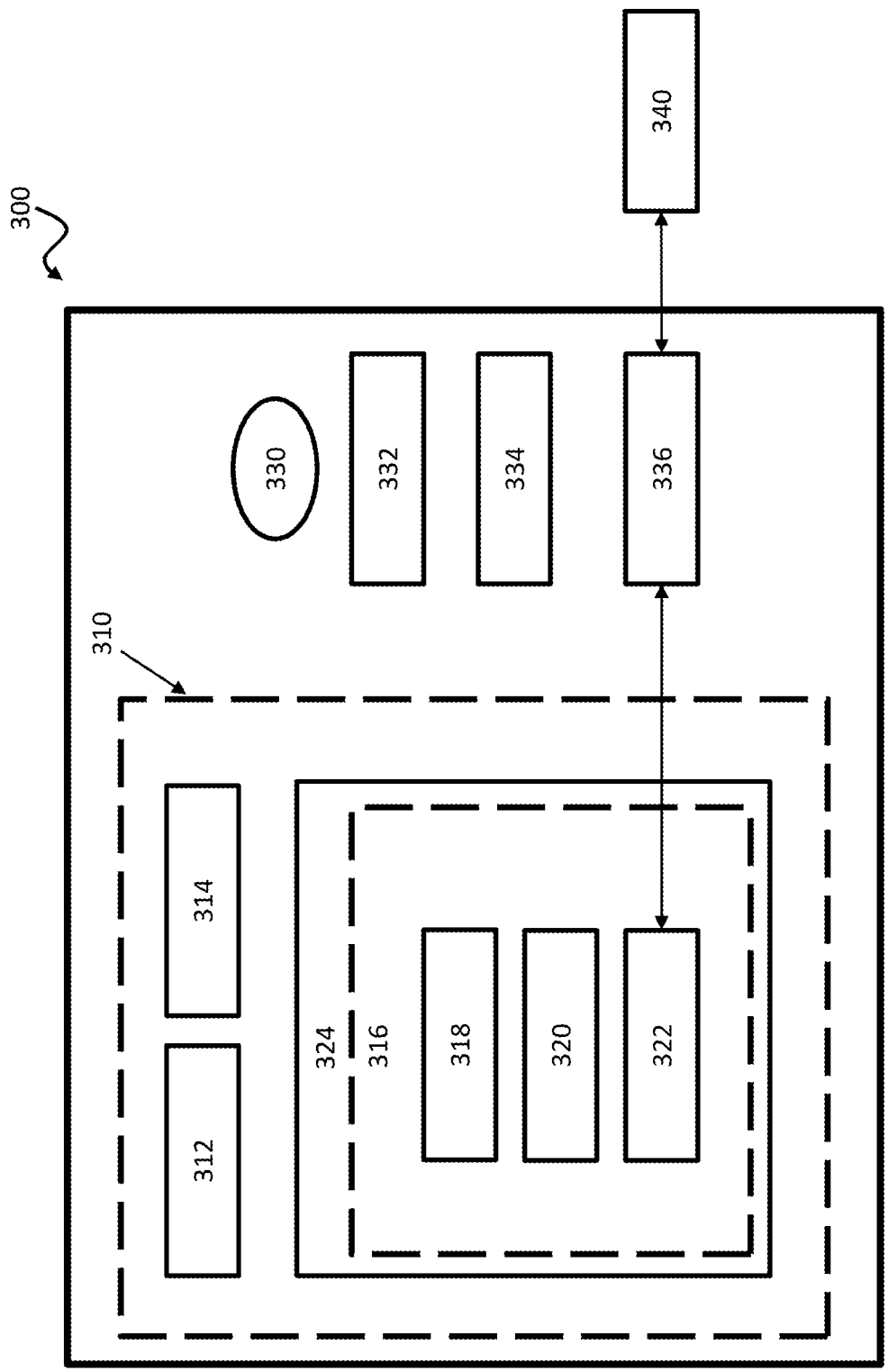
Figure 4A:
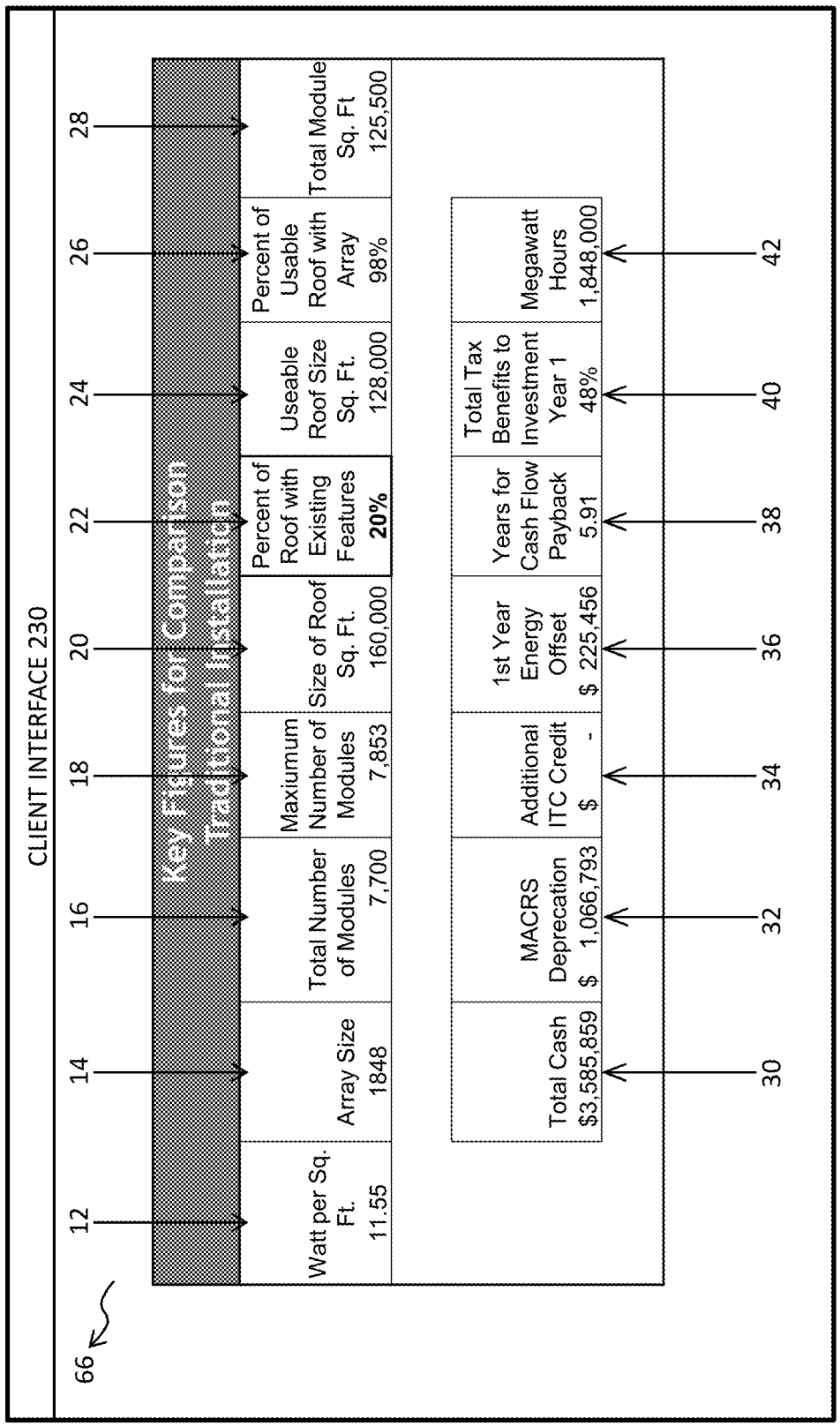
Figure 4B:
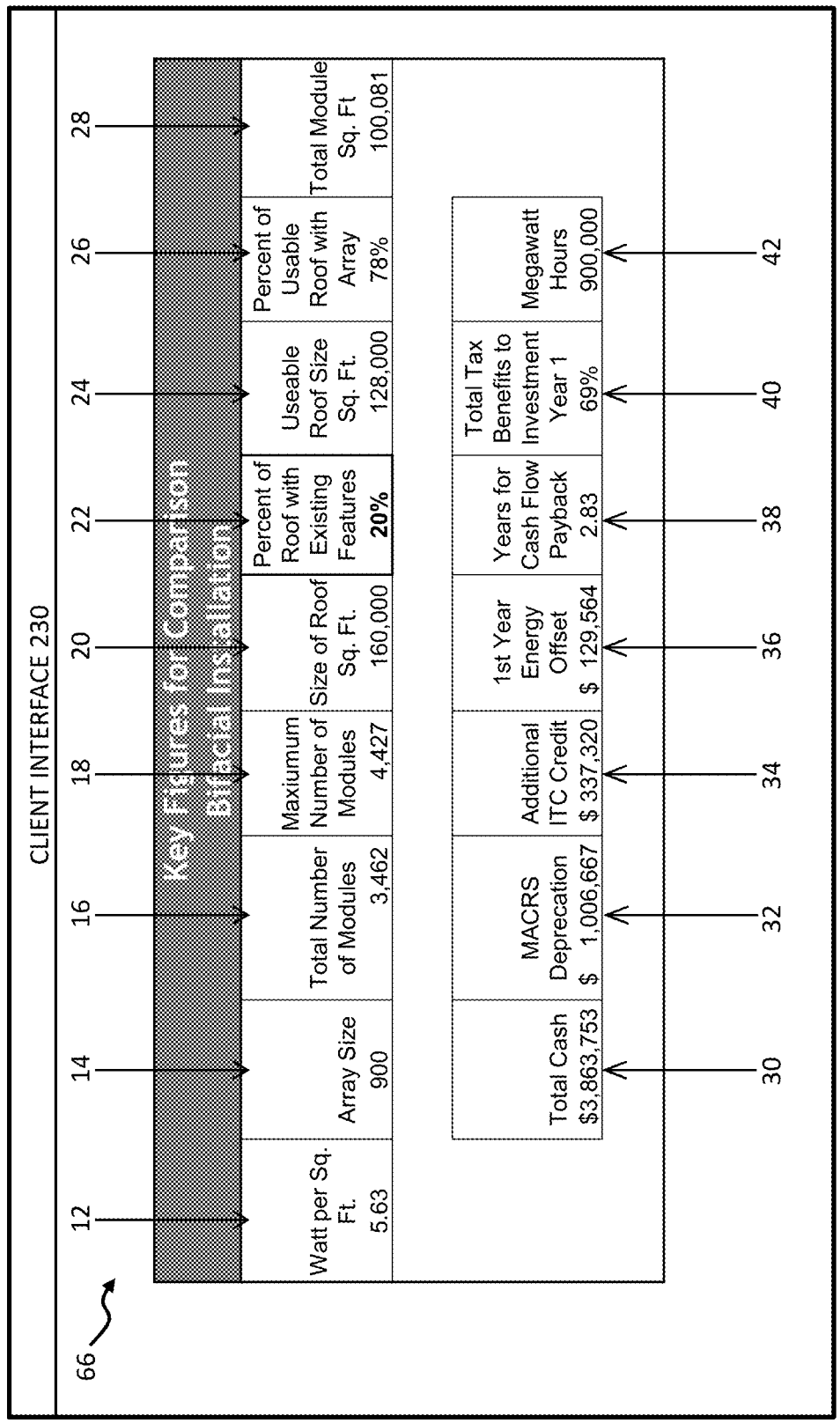

The accompanying drawings, which are incorporated in and constitute a part of this specification, illustrate embodiments of the present invention and together with the description, serve to explain the principles of this invention. In the figures:

FIG. 1.—Diagram of a networked environment.
FIG. 2.—Diagram illustrating a network environment for an analytics and design system.
FIG. 3.—Chart calculating a solar panel's footprint.
FIG. 4A.—Chart of key figures for effectiveness comparison of a traditional panel installation.
FIG. 4B.—Chart of key figures for effectiveness comparison of a bifacial panel installation.
FIGS. 5A-5D.—Example client interface showing the steps of designing a rooftop LTM installation.
FIG. 6.—Flowchart of creating a solar array schematic.

KEY TERMS albedo effect: the surface reflectivity (SR) of sunshine hitting the earth. The second panel of a bifacial panel collects reflected sunlight from the reflective surface of the building's roof.
albedo light: the proportion of the incident light that is reflected by a surface.
array: a series of solar panels connected to the same inverter. It is calculated by the Total Kilowatts/Sq. Ft×Sq. Ft. Roof.
azimuth correction factor: a factor used to correct the angle of the first side of a solar panel as the sun moves through the sky. Azimuth is the orientation with respect to True South at 180 degrees.
bifacial: a solar panel with opposing glass faces, on the front and back side of the panel, each designed to generate energy by allowing the collection of both direct and reflected light.
bifacial gain: the percent increase in electricity production of a module by the back side of the module (that side facing a reflective surface).
DC to AC size ratio: the ratio of the inverter's size, in maximum AC watts output, to the size of the array, in DC ATC watts. Also known as the array-to-inverter ratio.
DC to AC system loss: the amount of electricity lost when the DC electricity, collected by the modules, is converted into AC electricity.
EPC: engineering, procurement and construction.
feature: existing or planned constructed item on a roof that would prevent the use of that area for the installation of solar panels. This might include pathways, venting tubes, air conditioning systems, doors, landing pads, skylights, building identifiers, code requirements, etc.
geographic insolation factor: a factor to adjust the insolation measurement by a specific geographic location. See insolation.
incident light: light coming directly from the sun before it bounces on a surface. Compare albedo effect.
informed schematic: a schematic generated by first linking to, or retrieving, financial objectives in the analytic server or module.
insolation: a measurement of the amount of solar radiation based on the duration and intensity of solar radiation.
inverter: converts the variable direct current (DC) output of a photovoltaic solar panel into a utility frequency alternating current (AC) that can be fed into an electrical network. Also referred to variously as a converter or PV inverter.
kWh/kW DC: calculated as Production divided by Array Size.
Less Than Maximum: A calculation made by the analytic server to set the ceiling for the number of modules be placed in the schematic where the ceiling is less than the calculated maximum number of modules. See Array.
MACRS depreciation, depreciation: an accounting method where the capitalized cost (basis) of tangible property is recovered over a specified life by annual tax deductions for depreciation.

Maximum density design: a schematic, or method, that provides the highest count of modules the designer can place where the number approached the calculated maximum number of modules.

membrane: a type of roofing system used on flat roofs to prevent leaks and move water off the roof.

megawatt hours (MWh): calculated as KWh/1000. MWh is a common measurement to compare the output production of commercial solar installations.

module: a solar panel. The number of modules may be calculated as Total Watts/Watts per module, or Array Size*1,000/Watt per module.

panel: a solar panel.

photovoltaic (PV) cell: a solar cell, within a module, that converts energy from the sun into electricity.

production: the kilowatt hours generated by a solar installation in a year. Production is calculated as ((array size/DC to AC Size Ratio)×insolation×AC to DC System Loss×Number of Days in a Year+inverter efficiency)×(1+bifacial gain)).

production degradation: the incremental loss of a module's inefficiency for each year of the module's life.

reflectivity: a measure of the amount of light reflected off a surface, such as a roof.

traditional solar panel: a single-sided solar module that only generates electricity from a single side of the panel.

watt (W): calculated as KW×1,000.

watts per sq. ft.: calculated as watts/sq. ft. of the roof.

REFERENCE NUMERALS IN DRAWINGS

10 Traditional solar panels
20 Bifacial solar panels
12 Watt per Sq. Ft.
14 Array Size, kWh
16 Number of Modules
18 Maximum Number of Modules
20 Size of Roof Sq. Ft. (user input)
22 Percent of Roof with Existing Features (user input)
24 Usable Roof Size Sq. Ft.
26 Percent of Usable Roof with Array
28 Total Module Sq. Ft
30 Total Cash, Currency
32 Deprecation, Currency
34 Additional ITC Credit, Currency
36 1st Year Energy Offset, Currency
38 Cash Flow Payback, Years
40 Total Tax Benefits to Investment Year 1, Percent
42 Megawatts hours (MWh)
66 Chart of Key Figures for Comparison
100 Flowchart of a networked environment
110 Client devices
130 Servers
140 Data storage
150 Database server
160 Single, cloud server
170 Networks
200 Flowchart of LTM networked environment
210 Browser
230 Client interface
240 Analytics server
250 Design server
300 Computing device
310 Application components
312 System memory
314 Processing unit
316 Operating system
318 Analytic program module
320 Design program module
322 Communication application
324 ROM/RAM
330 Storage
332 Input devices
334 Output devices
336 Communication connection
340 Other devices, foreign devices
500 Worksite
510 Feature
510a Feature, venting fan
510b Feature, HVAC
510c Feature, Access stairwell
610 Select Financial Objective to Determine LTM Panels
620 Select Worksite Space and Remove Estimated Feature Space
630 Determine Max. Array Size
640 Convert Financial Objectives to LTM Array Size
642 Display LTM Module in Client Interface
650 Convert LTM Array Count to LTM Module Count
662 Place Borders in Schematic
664 Place Features in Schematic
670 Place Modules in Schematic
680 Publish

DETAILED DESCRIPTION OF THE DRAWINGS

Referring to the drawings, in which like numerals represent like elements,

FIG. 1

FIG. 1 depicts a diagram of a networked environment 100, where a system according to embodiments may be implemented. An analytic server 240 and design server 250 may be managed over a communication application 322 over one or more servers 130 or a single server (such as a cloud server 160), such as a hosted service. Modern repository solutions such as content management stores (CMS) allow users to create expansive data and file repositories required for modern CMS systems. These systems provide security modules; real-time design; design project management through task and calendar modules. The communication application 322 may communicate with client interfaces 230 on individual client devices 110 such as a smart phone, a laptop computer, or desktop computer through network(s) 170.

A communication application 322 may direct a layout plan for bifacial solar panels 20 with user-provided configuration information from an analytics server 240. The application may display the content of the analytic server 240 and design server 250 through a unified view with access to the integrated message and document content.

Client devices 110 may enable access to applications executed on remote server(s) 130. The server(s) 130 may retrieve or store relevant data from/to data store(s) 140 directly or through database server 150.

Network(s) 170 may comprise any topology of servers 130, clients, Internet service providers, and communication media. A system 100 according to embodiments may have a dynamic or static topology. Network(s) 170 may include secure networks 170 such as an enterprise network 170, or an unsecure network 170 such as the Internet or a wireless open network 170.

Network(s) 170 may also coordinate communication over other networks such as Public Switched Telephone Network (PSTN) or cellular networks. Furthermore, network(s) 170 may include short range wireless networks such as Bluetooth or similar ones. Network(s) 170 provide communication between the nodes described herein. By way of example, and not limitation, network(s) 170 may include RF, wireless media such as acoustic, infrared and other wireless media.

Many other configurations of applications, data sources, computing devices 300, and data distribution systems may be employed to manage a bifacial panel 20 plan. Furthermore, the networked 170 environments discussed in FIG. 1 are for illustration purposes only. Embodiments are not limited to the example applications, modules, or processes.

FIG. 2

FIG. 2 shows a diagram 200 illustrating a networked 170 environment, where a communication application 322 may manage analytics, planning and CMS services according to some embodiments. The computing devices 300 and computing environments shown in diagram 200 are for illustration purposes. Embodiments may be implemented in various local, networked, and similar computing environments employing a variety of computing devices 300 and systems.

In an example environment illustrated in diagram 200, a client interface 230 (e.g. a browser 210) executed on client device 110 may display a unified view of analytics and design. The unified view may display services provided on an analytics server 240 and design server 250 through network(s) 170. The server 250 may execute a communication application 322 to retrieve analytics from server 240. The servers 240 and 250 may provide their respective services including analytics and design plans independently of the client device 110 and corresponding client interface 230. In some embodiments, servers 240 and 250 may communicate directly with each other. The integrated content may be displayed to a member having access to the communication application 322 through the unified view. The communication application 322 may also enforce system policies on the integrated content. The application may retrieve data, documents, or images from the design server 250, the analytics server 240, or a third party. The analytic server 240 and the design server 250 may comprise the same storage, processor and memory.

FIG. 3

FIG. 3, and the associated specification, outline a general description of a computing environment in which the present embodiments may be implemented. The illustration is a block diagram of an example computing operating environment for an application, according to embodiments, such as computing device 300. In a basic configuration, the computing device 300 may include system memory 312 and at least one processing unit 314. A computing device 300 may include a plurality of processing units 314 that cooperate.

Depending on the exact configuration and type of computing device 300, the system memory 312 may be volatile (such as RAM 324), non-volatile (such as ROM 324, flash memory, etc.) or some combination of the two. System memory 312 typically includes an operating system 316 suitable for controlling the operation of the platform. The system memory 312 may also include one or more software applications such as analytic program modules 318, design program module 320 and communication application 322.

The design program module 320 may create and manage a schematic, plan, layout, or designs of bifacial solar panels 20 in a physical environment. The analytics program module 318 may provide the data and calculations associated with space, output, costs, revenues, and tax implications.

The communication application 322 may also integrate messages, email associated documents and CMS services. This basic configuration is illustrated in FIG. 3 by the dashed lines surrounding the application components 310.

Computing device 300 may have additional features or functionality. For example, the computing device 300 may also include additional data storage devices 330 (removable and/or non-removable) such as, for example, magnetic disks, optical disks, or tape. Computer readable storage 330 media may include volatile and nonvolatile, removable and nonremovable media implemented in any method or technology for storage of information, such as computer readable instructions, data structures, program modules, or other data.

Computer readable storage 330 media is a non-transitory computer readable memory device. System memory 312, removable storage 330 and non-removable storage 330 are all examples of computer readable storage 330 media. Computer readable storage 330 media may include magnetic cassettes, magnetic tape, magnetic disk storage or other magnetic storage devices, RAM 324, ROM 324, EEPROM, flash memory or other memory technology, CD-ROM, digital versatile disks or other optical storage, or any other medium which can be used to store the desired information and which can be accessed by computing device 300. Any such computer readable storage media may be part of computing device 300. Computing device 300 may also have input devices 332 such as camera input device, mouse, pen, keyboard, voice input microphone, touch input device, and comparable input devices 332. Output devices 334 such as a voice, printer, display, speakers, and other types of output devices may also be included.

Computing device 300 may additional include communication connections 336 to allow the device 300 to communicate with foreign devices 340. This communication may happen via a wireless network 170 in a distributed computing environment, a receiver/transmitter such as a satellite link, a wireless network, a direct-wired network, a mobile link where the last link is wireless, and other substitutable mechanisms. The other devices 340 associated to the communication connection 336 may include computer devices that execute communication applications 322, storage servers 140, Internet servers 160, application servers, and comparable devices.

Communication connections 336 is one example of communication media. Communication media can include therein computer readable instructions, program modules, or data in a modulated data signal, such as a carrier wave or other transport mechanism, and includes any information delivery media. Modulated data signal is a signal that has at least one of its characteristics set or changed in such a manner as to encode information in the signal. For instance, communication media includes wired media such as a wired network or direct-wired connection, and wireless media such as RF, infrared, acoustic and other wireless media.

Alternate embodiments also include methods. These methods can be implemented in any number of ways, including the methods described in this document. One such way is by machine operations, of devices of the type described in this document. Another embodiment is for one or more of the individual operations of the present methods be performed by one or more human operators performing portions, such as keying project-specific data. These human operators each can be only with a machine that performs a portion of the program.

FIGS. 4A-4B

Turning now to FIGS. 4A-4B is a chart of key figure for comparison 66 comprising a demonstration of the use of the invention to compare a traditional monofacial 10 installation to the bifacial 20 installation.

The user enters the Percent of Roof with Existing Features 22 in the user interface 210 on the client device 110. Existing features 510 are unconstructed and constructed items on the roof, or outdoor surface, that prohibit the placement of solar panels in the space. This may include HVAC units, ventilation systems, access points, and access paths unassociated with the solar installation. Generally, it is estimated that 20% (twenty percent) to 30% (thirty percent) of a roof has existing features.

The Key Figures for Comparison Chart 66, FIGS. 4A-4B, data then pulls from analytics server 240, or data storage 140, through the client interface 230 on the client device 110:

Watt per Sq. Ft. 12
Array Size 14
Total Number of Modules 16
Size of Roof Sq. Ft. 20
Total Cash 30
MACRS Depreciation 32
Additional ITC Credit 34
$1^{st}$ Year Energy Offset 36
Years for Cash Flow Payback 38
Total Tax Benefits to Investment Year 1 40
Megawatt hours 42

The Percent of Roof With Existing Features 22 is then multiplied by Size of Roof Sq. Ft. 20 and subtracted from the Size of Roof Sq. Ft. 20 to determine the Usable Roof Size Sq. Ft. 24 which is the square footage of the roof that can be used for a solar installation.

To determine the Maximum Number of Modules 18 that will fit within the Usable Roof Size Sq. Ft. 24, the footprint of each panel (plus inter-row Sq. Ft.) is divided into the Usable Roof Size Sq. Ft. 24.

To calculate the Total Module Sq. Ft 28 that fit within the Usable Roof Size Sq. Ft. 24, the footprint of each panel (plus inter-row Sq. Ft.) is multiplied by Total Number of Modules 16. Total Module Sq. Ft. 28 is then divided into Usable Roof Size Sq. Ft. 24 to produce Percent of Usable Roof with Array 26.

FIG. 4A is an analysis of an existing warehouse roof 'Traditional Installation' with approximately 7700 (seven thousand seven hundred) panels on a 160,000 (one hundred and sixty thousand) square foot roof producing 1.8 (one point eight) megawatts hours (MWh) 42 representing a 90 (ninety) percent offset of the building's annual energy costs of approximately $250,000 (two hundred and fifty thousand dollars). Assuming Percent Roof with Existing Features 22 is 20% (twenty percent), at 7700 (seven thousand seven hundred) Total Number of Modules 16, accounts for 98 (ninety-eight) percent of the Usable Roof Size Sq. Ft 24. This maximized installation meets the design objectives for monofacial panels because it allows the manufacturer to scale large projects, the seller to maximize commission, the planners to maximize fees, installers to maximize labor costs, and the seller to internally sell the maximum possible energy offset. However, the Years for Cash Flow Payback 38 is 5.91 (five point ninety-one) years with the Total Tax Benefits to Investment Year 1 40 is only 48 (forty-eight) percent.

FIG. 4B is chart of key figure for comparison 66 comprising comparative analysis of the same building with a 'Bifacial Installation.' Both installations have a Total Cash 30 of approximate $3.5M (three point five million dollars). Due to the higher costs of a bifacial 20 installation, the bifacial has only 40 (forty) percent of Total Number of Modules 16 as the monofacial installation in FIG. 4A. With a conservative 18% (eighteen percent) of Bi-Facial Gain, the Megawatt hours 42 for the bifacial 20 installation is 44% of the monofacial installation. Despite, relatively similar Total Cash 30 outlay for the two installations, the Years for Cash Flow Payback 38 for the bifacial 20 installation is half of that of the traditional 10 installation. For the bifacial 20 installation, Total Tax Benefits to Investment Year 1 40 is 72% (seventy-two percent) versus only 48% (forty-eight percent) for the traditional 10 installation in FIG. 4A.

FIGS. 5A-5B

FIGS. 5A-5D present the general steps of planning a bifacial solar panel 20 schematic based on the prepared financial data (detailed in the associated provisional application) that may be stored on data storage 140 device. The described methods may be performed in any order, simultaneously or alternately.

FIG. 5A

Figure 5A:
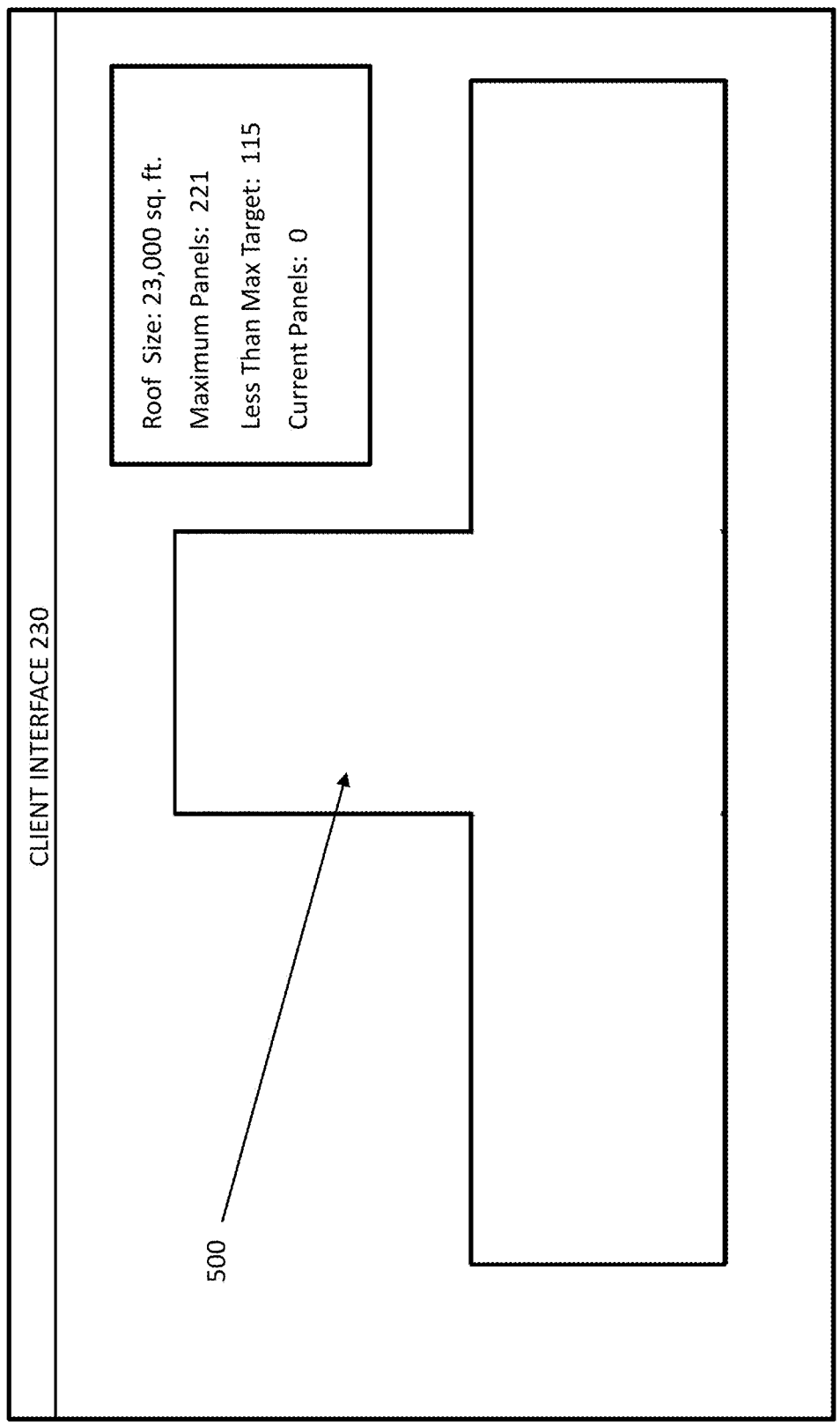
Figure 6:
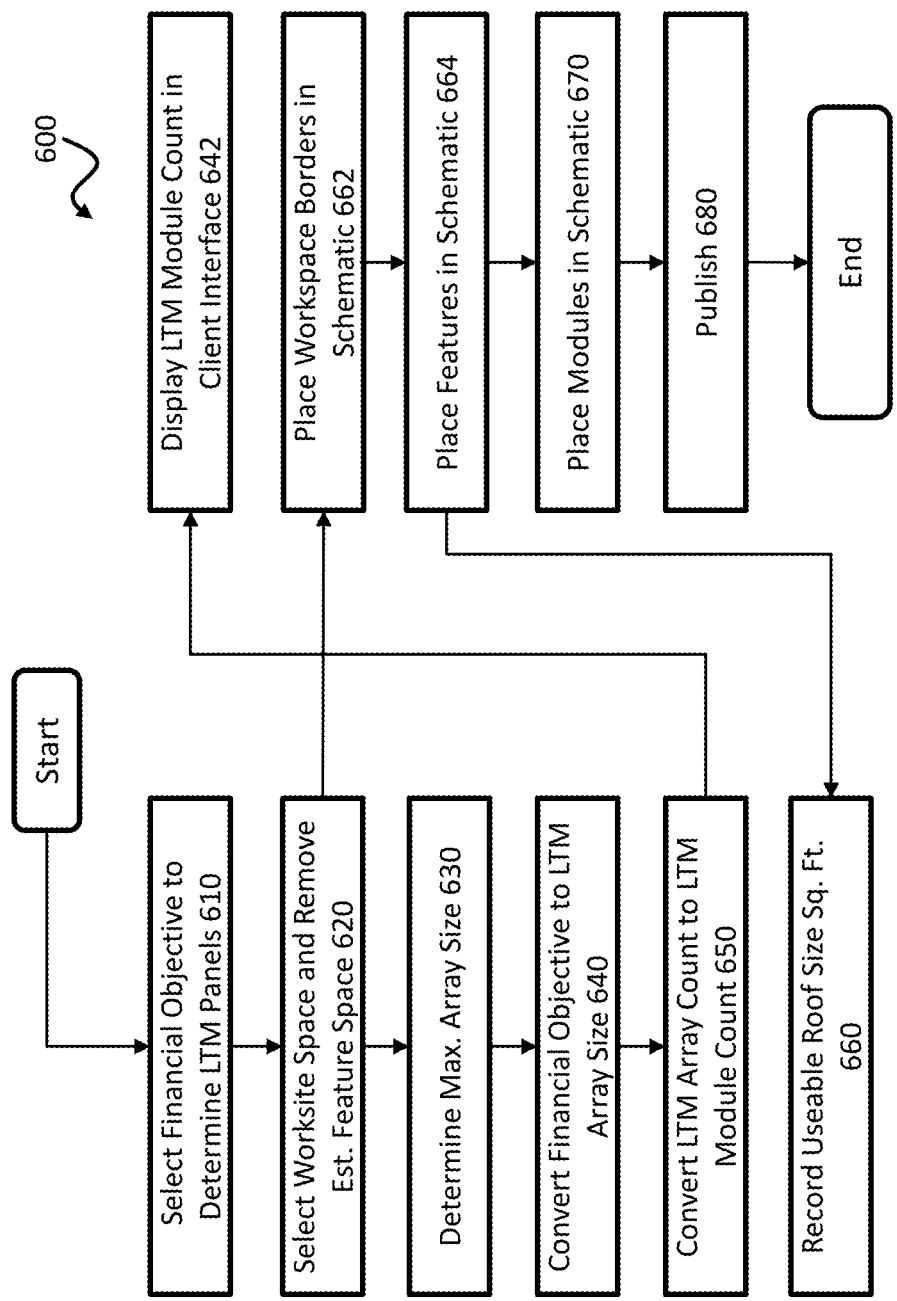

FIG. 5A is the representation of a client interface 230 in the first step of preparing a schematic of a bifacial 20 solar installation. The polyline 'T' shape represents an example roof worksite 500. However, due to the endless design possibilities the image may be composed of circles, curves, arcs, triangles, polygons, lines, etc.

The worksite 500 may be created using any number of methods including scanning an overhead image, importing a *.DWG AutoCAD file, entering coordinates of the boundaries, or manually drawing the space on the client interface 230. Due to the dependence of the panel on the orientation to the sun, the directional placement may be added. In the present invention, the size of the space is known and provided by the analytics server 240 to the client interface 230.

In the prior art, the polyline shape would be unbound from the financial and output objectives of the project. However, because the present method is tied to the predetermined financial less than maximum (LTM) data, the system not only knows the boundaries of the schematic but is informed and able to show the calculated design criteria for the project. In the box of the upper right hand corner of the client interface, the maximum number of panels is projected by the analytics server 240 by estimating the percent of roof with existing features 22 to calculate the useable roof size 24 which is then divided by the space requirements of each panel. The space requirement of each panel may be calculated using the height of the panel; width of the panel; linear space between panels; tilt; minimum space between the front of one panel and back of the facing panel; racking; etc. However, because the objective is not to design a maximum output design, the system may use another financial objective such as total cash 30, depreciation 32, years for cash flow payback 44, total tax benefits to investment year 1 40, etc. The maximum energy offset can be measured in kilowatt hours, such as megawatt hourss 42, or in currency, such as $1^{st}$ year energy offset 36. The informed data may be encoded in the metadata of the design, may be pre-existing encoded data in the file, may be stored on the data storage 140 device, or may be independently presented to the client interface 230 by the analytics server 240.

In the example, the roof size 20 was present by the analytic server 240 as 23,000 (twenty-three thousand) sq. ft. The example server 240 also provided the client interface 230 with maximum number of panels 18 as 221 (two hundred and twenty-one), the LTM Target of 115 (one hundred and fifteen). The example design server 250 is showing the current bifacial solar panel 20 count of 0 (zero). The LTM Target becomes a ceiling that may mark any panels added over 115 (one hundred and fifteen) as illegal or may prevent the addition of more panels once the target is reached.

In the prior art, the outline would be created in client interface 230 and then be keyed with properties associated with the site such contact information, drawing scale, location data, utility information, roof load limits, etc. However, that data would still be uninformed of the financial objectives because the information would not be available until after the finalization of the design. As specified in 5D, the final design in the prior art becomes dependent on the designer to maximize the output of the design by manually planning around the inherent limitation of any space. Once all the limitations are overcome, and finalized, the resulting financial implications are known.

FIGS. 5B-5C

Figure 5B:
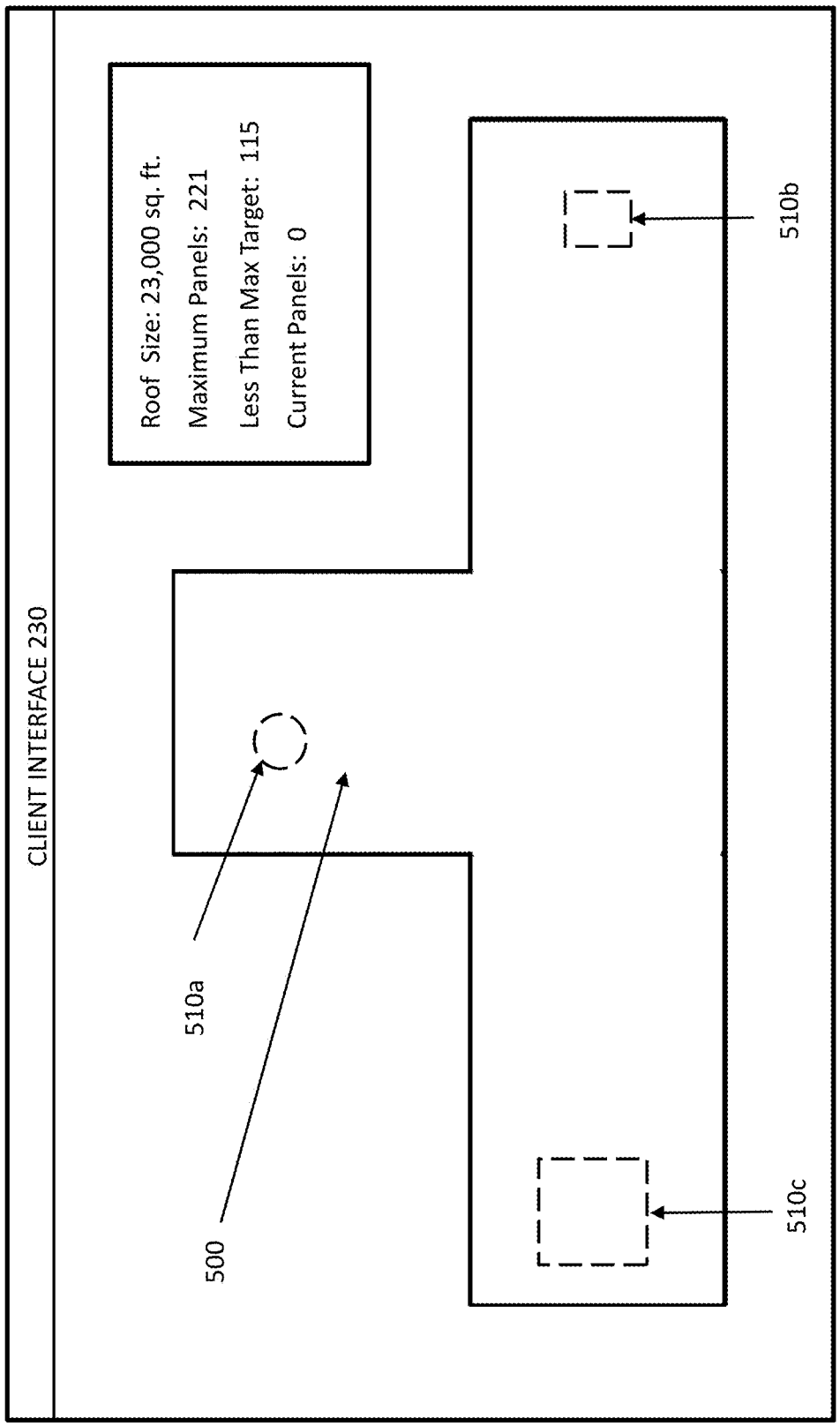
Figure 5C:
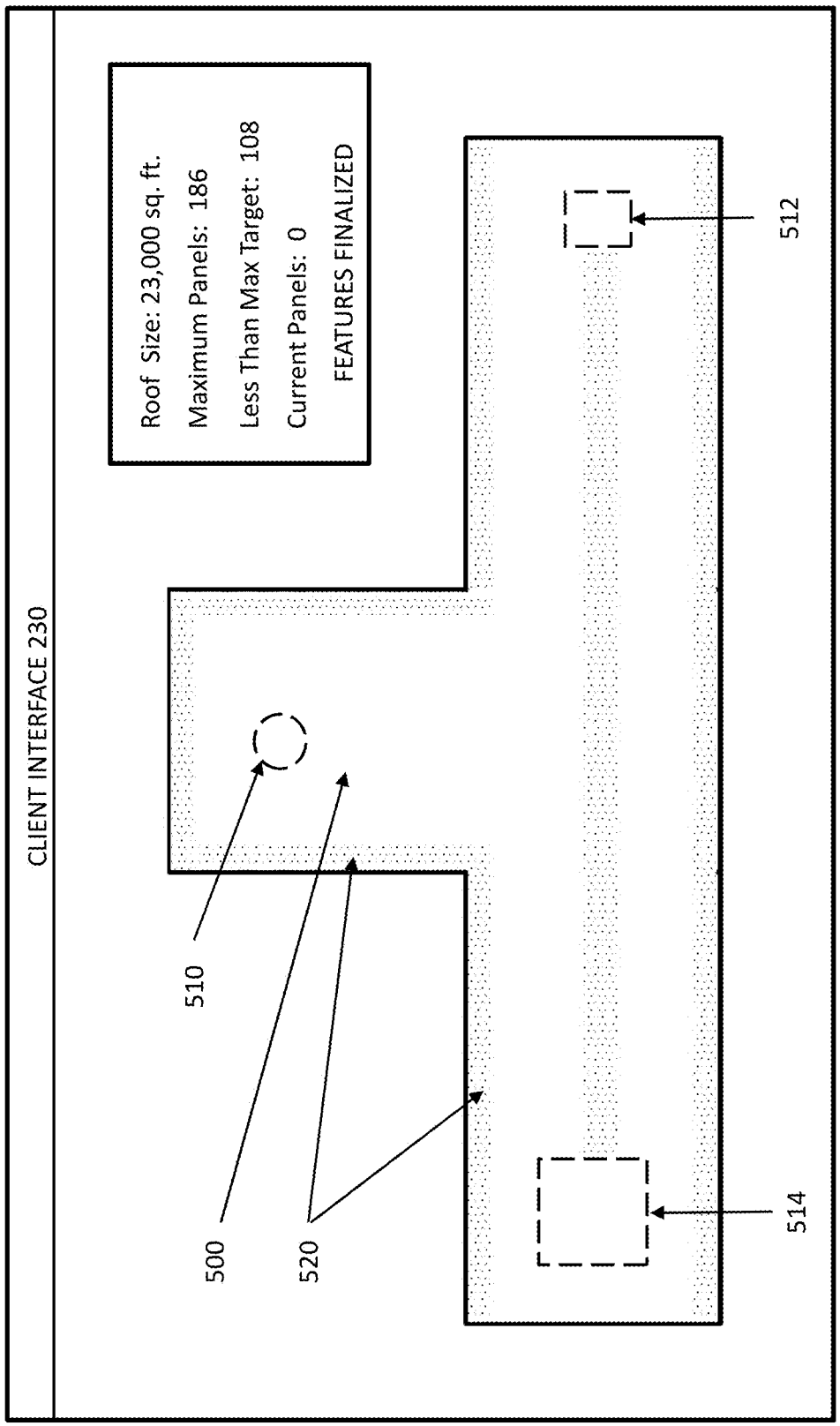
Figure 5D:
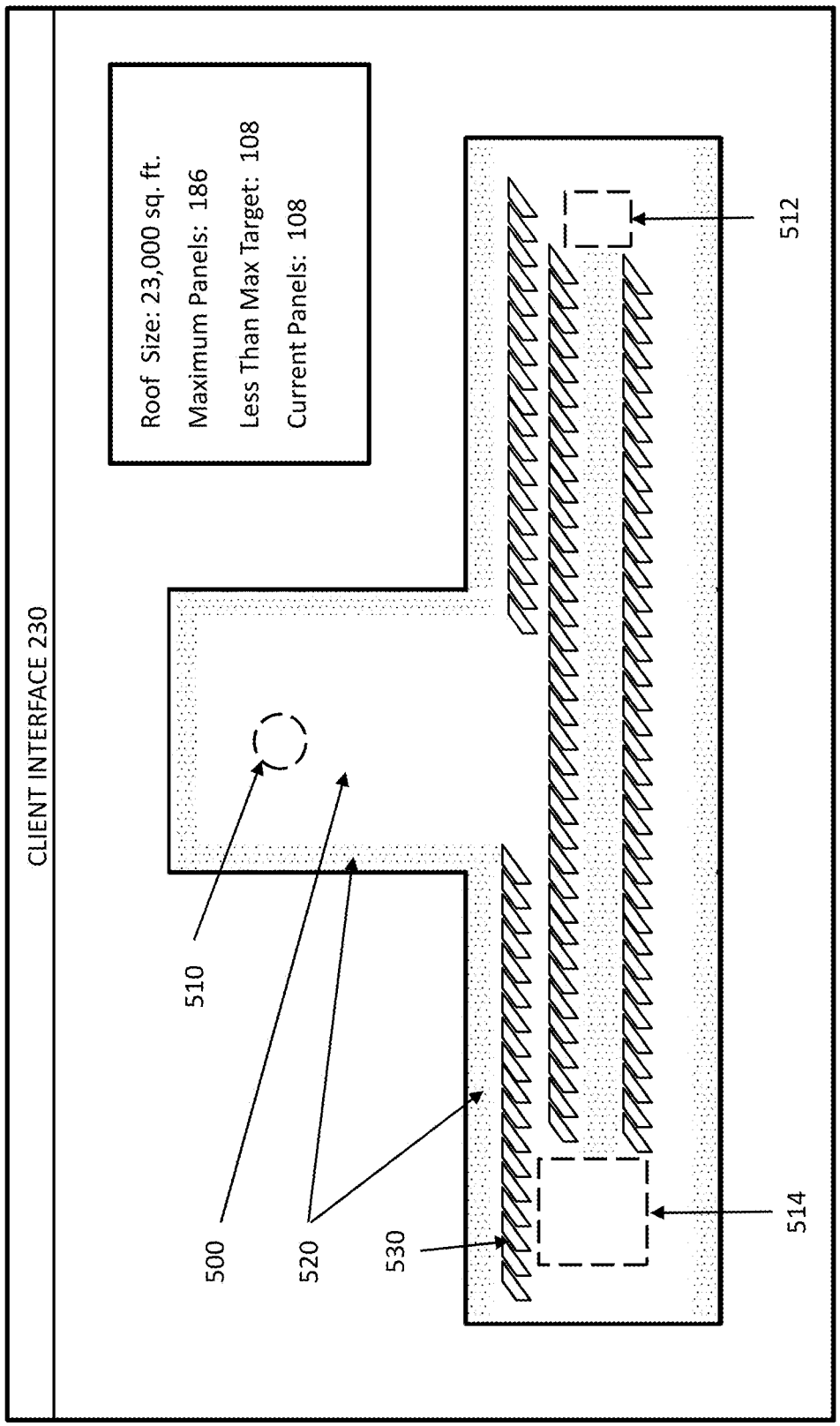

FIGS. 5B-5C add features 510 to the schematic on the client interface 230 to calculate the actual useable roof size 24. In the analytic server 240, the percent of roof with existing features 22 may be estimated by scanning an aerial image, importing a CAD file, or with a guestimate from the designer.

There are two types of features 510 present in a schematic: solid and linear 520. In the FIG. 5B, the designer, using the client interface linked to the design server 250, has placed three solid features 510 on the worksite 500: a venting fan 510a, a HVAC unit 510b, and an access stairwell 510c. The percent of roof with existing features 22, to calculate the useable roof size 24, is still estimated because the linear features 520 are yet undefined. In an alternate embodiment, the percent of roof with existing features 22 estimate may be informed by each addition of a new feature 510 resulting in a statistical adjustment to the estimate by passing the feature 510 data from the design server 250 to the analytic server 240 and then retrieving the new projection from the analytic server 240 and passing it to the client interface 230. In the example, the addition of feature 510 leaves the maximum panels 18 and LTM target as the same as the FIG. 5A because the percent 22 estimate is maintained.

Solid features 510 may include walls, exhaust systems, HVAC systems, pipes, conduits, skylights, window cleaning equipment, stairwells, railing, elevator equipment, drains, antennas, signage, satellites, etc.

In FIG. 5C, the linear features 520 are added to the schematic on the client interface 230, shown as dotted lines in this example illustrations, and the schematic features 510 are fully represented.

These linear features 520 establish boundaries and may include spaces for utility right of way, zoning right of way, setbacks, solar panel access requirements, shadows, helipad space, exteriors of access space, flood plains, environmentally restricted areas, etc.

Once finalized, the square feet occupied by the features 510 may be passed from the design server 250 to the analytic server 240 to calculate the actual percent of roof with existing features 22; new unprojected maximum panels 18; new unprojected LTM target; and other financial and spatial data. Then the client interface 230 may retrieve the new unprojected maximum panels 18 and LTM target. In the example in 5C, the maximum panels 18 are reduced by the analytic server 240 to 186 (one-hundred and eighty six) maximum panels and the LTM target, or ceiling, is reduced to 108 (one hundred and eight). Since no panels have been placed in the schematic, the current panels still show 0 (zero).

Now that the LTM target is finalized based on the established financial objectives and the useable foot size sq. ft 24, the designer may lay panels into the schematic by using the client interface 230.

In the 5D example the designer has added 108 (one hundred and eight) bifacial solar panels 20 to match the analytics server's 240 ceiling of 108 (one hundred and eight) panels 20.

In the prior art, the tactics of the designer to create the schematic involves trying to maximize the space used in the boundaries provided. This involves selecting the most suitable bifacial 20 model, adding the features 510, placing the modules 530 on the worksite 500 schematic, estimating the projection outputs, recalculating return, and adjusting the number and layout of the modules 530, selecting and alternate bifacial 20 model, etc. As the number of modules 16 grows, these co-dependent operations continually change the design requirements, identify illegal parameters, and adjust the resulting power outputs. Even adding a new module 530, can impact the entire design including adding new linear features 520 and new supporting electronics. The trial-and-error complexity of these designs makes the process a form of dynamic art that creates decisions, and a final design, that is as qualitative as it is quantitative. This complexity means a single design may often take months of planning. This requires large system resources for storing, processing and communicating traditional 10 design.

By beginning the design with a LTM target, in the present invention, associated with analytics parameters, the number of panels can be automatically placed on the schematic to exactly reach the analytic parameters. This reduces total planning time which improves total system performance and reduces systems requirements. However, it should be understood that a LTM design is not a less expensive installation design. While LTM implies less modules 530, the EPC costs can be substantially more expensive than for a traditional 10 installation.

FIG. 6

Finally, turning to FIG. 6, showing a logic flow chart for the overall process of generating a schematic using the less than maximum system method according to embodiments. Process 600 may be implemented by an analytics or design application in some examples.

Process 600 begins with operation 610 of selecting a financial objective, stored on the analytics system 240, to determine the LTM number of panels to be installed. This financial objective is often quantified by the clients as return on investment, years for cash flow payback 38, total tax benefits year 1 40, etc. At operation 620 on the analytics server 240, the worksite 500 space square footage is selected, or keyed, or calculated; then, the system estimates the total amount of worksite 500 square footage with features 510 (generally estimated between 20 (twenty) and 30 (thirty) percent). During operation 630, using the estimation from operation 620, the maximum array size 14 is calculated on the analytics server 240. The maximum array financially unbound size is calculated by the Total Kilowatts/Sq. Ft×Sq. Ft. Roof or Total Kilowatts/Usable Roof Sq. Ft.

The next operation, 640, is to calculate, on the analytics server 240, the array size 14 limited by the financial objective. As an example, and not a limitation, if the building's owner wish to have a Years for Cash Flow Payback of 2.83 years, as in FIG. 4B example, then the array size 14 would be reduced to meet that financial objective. However, while the LTM array size 14 would be reduced from the maximum array size 14, the EPC costs would be anticipated to be higher than a traditional 10 schematic. At operation 650, the array is converted, on the analytics server 240, to the number of modules 16 as Array Size*1,000/Watt per module.

During operation 642, at the client interface 230, the LTM Module Count is displayed. This count may also be used by the design program module 320 to set a limitation on the number of modules 16 allowed on the schematic. This ceiling may prevent adding any modules 530 that would exceed that count or simply mark the modules 530 as illegal. At operation 662 at the client interface 230, the borders for the worksite 500 are created, or placed, in the schematic. The worksite 500 borders may be created using any number of methods including scanning an overhead image, importing a *.DWG AutoCAD file, entering coordinates of the boundaries, or manually drawing the space on the client interface 230. The scan or import may be done by a program module at the client interface 230 but stored on the design and/or analytics servers 250,240. At operation 660, the analytics server 240 stores the actual usable roof size 24 now that the actual feature 510 square foot is known. During operation 662, using the client interface 230, the planner place the workspace borders in the schematic. The next operation, 664, at the client interface 230, the user marks the location and size of solid and linear features 520. At operation 670, the user, at the client interface 230, locates modules 530 on the schematic. The modules 530 may be automatically generated and located; or manually selected and positioned; or a combination thereof. Once finalized, as a last operation 680 on the client interface 230, the schematics may be saved for publication, such as communication or display.

Although the present disclosure and its advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

In the foregoing description, and the following claims, method steps and/or actions are described in a particular order for the purposes of illustration. It should be appreciated that in alternate embodiments, the method steps and/or actions may be performed in a different order than that described. Additionally, the methods described above may be embodied in machine-executable instructions stored on one or more machine-readable mediums, such as disk drives, thumb drives or CD-ROMs. The instructions may be used to cause the machine (e.g., computer processor) programmed with the instructions to perform the method. Alternatively, the methods may be performed by a combination of hardware and software. While illustrative and presently preferred embodiments of the invention have been described in detail herein, it is to be understood that the inventive concepts may be otherwise variously embodied and employed, and that the appended claims are intended to be construed to include such variations, except as limited by the prior art.

Benefits, other advantages, and solutions to problems have been described herein with regard to specific embodiments. However, the advantages, associated benefits, specific solutions to problems, and any element(s) that may cause any benefit, advantage, or solution to occur or become more pronounced are not to be construed as critical, required, or essential features or elements of any or all the claims of the invention. As used herein, the terms "comprises", "comprising", or any other variation thereof, are intended to cover a non-exclusive inclusion, such that a process, method, article, or apparatus composed of a list of elements that may include other elements not expressly listed or inherent to such process, method, article, or apparatus.

ADVANTAGES

From the description, above, a number of advantages become evident for the "Less Than Maximum Effective Solar Design." The present invention provides all new benefits for computing systems, including:
  a) reducing the resources required for recording the metadata;
  b) reducing the metadata file size;
  c) reducing the processor requirements to plan a schematic;
  d) reduce system memory requirements to operate the client interface;
  e) reduces the amount of storage space required to save the schematic;
  f) reduce broadband use to operate the communication connection;
  g) reduce subscription requirements to operate SAAS systems.

What is claimed is:

1. A method executed on a computing device for generating a less than maximum bifacial solar panel schematic, the method comprising:
  a. through a client interface, selecting a financial objective of roof and array depreciation stored on an analytic server;
  b. on an analytic server, record the size of roof's worksite space;
  c. on the analytic server, record an estimate of a features space and multiply into a size of the roof to calculate a usable roof size;
  d. on the analytics server, calculating, by one or more processing units, a maximum number of panels by dividing a footprint of each bifacial panel added to the panel's inter-row space into the usable roof size;
  e. on the analytics server, using the financial objective, calculate, by one or more processing units, a less than maximum number of the bifacial solar panels that does not exceed depreciation associated with the maximum number of panels;
  f. on the client interface, display, by one or more processing units, providing results of less than maximum number of the bifacial retrieved from the analytics server;
  g. on the client interface, generate, by one or more processing units, a roof's worksite border image on a schematic;
  h. on the client interface, add, by one or more processing units, one or more features on the worksite;
  i. on the client interface, add, by one or more processing units, one or more modules on the worksite up to the less than maximum module count;

j. after placing each module on the schematic, the analytic server tests if the number of modules is less than or equal to the less than maximum target and prevents the addition of illegal modules on the worksite;
k. storing a design and publishing an informed schematic in a network environment, by one or more processing units, with a unified view of analysis and design, to other devices.

\* \* \* \* \*